(12) United States Patent
Fan et al.

(10) Patent No.: US 11,778,857 B2
(45) Date of Patent: Oct. 3, 2023

(54) ORGANIC ELECTROLUMINESCENT DEVICE AND DISPLAY PANEL

(71) Applicant: BOE TECHNOLOGY GROUP CO., LTD., Beijing (CN)

(72) Inventors: Xing Fan, Beijing (CN); Lingjun Dai, Beijing (CN); Chao Kong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 207 days.

(21) Appl. No.: 17/486,559

(22) Filed: Sep. 27, 2021

(65) Prior Publication Data

US 2022/0255043 A1    Aug. 11, 2022

(30) Foreign Application Priority Data

Feb. 7, 2021  (CN) .......................... 202110177188.7

(51) Int. Cl.
| | |
|---|---|
| *H01L 51/50* | (2006.01) |
| *H10K 50/858* | (2023.01) |
| *H10K 50/13* | (2023.01) |
| *H10K 50/814* | (2023.01) |
| *H10K 50/824* | (2023.01) |

(52) U.S. Cl.
CPC ........... *H10K 50/858* (2023.02); *H10K 50/13* (2023.02); *H10K 50/814* (2023.02); *H10K 50/824* (2023.02)

(58) Field of Classification Search
CPC .............................. H10K 50/858; H10K 50/13
See application file for complete search history.

(56) References Cited

FOREIGN PATENT DOCUMENTS

| CN | 105093377 A | 11/2015 |
|---|---|---|
| CN | 106067517 A | 11/2016 |
| CN | 108666444 A | 10/2018 |
| CN | 110299472 A | 10/2019 |
| CN | 209981278 U | 1/2020 |

OTHER PUBLICATIONS

China Patent Office, CN202110177188.7 First Office Action dated Jul. 26, 2022.

*Primary Examiner* — Anthony Ho
(74) *Attorney, Agent, or Firm* — HOUTTEMAN LAW LLC (57) ABSTRACT

The present disclosure provides an organic electroluminescent device and a display panel. The organic electroluminescent device includes a first electrode, a second electrode and a light-emitting layer disposed between the first electrode and the second electrode; a functional electrode is disposed on a side of at least one of the first electrode and the second electrode away from the light-emitting layer; the functional electrode includes a first layer-stacked structure including a plurality of first light-transmitting layers and at least one second light-transmitting layer; the first and second light-transmitting layers are stacked alternately; in the first layer-stacked structure, both the layer closest to the light-emitting layer and the layer farthest from the light-emitting layer are the first light-transmitting layers; a refractive index of the first light-transmitting layer is greater than a refractive index of the second light-transmitting layer.

16 Claims, 4 Drawing Sheets

ORGANIC ELECTROLUMINESCENT DEVICE AND DISPLAY PANEL

CROSS-REFERENCE TO RELATED APPLICATIONS

The present application claims the priority of Chinese Patent Application NO. 202110177188.7, filed on Feb. 7, 2021, the contents of which are incorporated herein in their entirety by reference.

TECHNICAL FIELD

The present disclosure relates to the field of display technology, and particularly relates to an organic electroluminescent device and a display panel.

BACKGROUND

With the development of display panels, the display panels can be applied in various different scenes, and requirements on the display panels are different in the different scenes, so that requirements on light emitting devices in the display panels are also different in the different scenes. For example, in an application scenario of a transparent display panel, a transmittance of the light emitting device needs to be relatively large, and in an application scenario of a dual-sided display panel, the light emitting device needs to have a relatively high reflectivity on both sides thereof. In the related art, a structure of the light emitting device is largely changed for the display panels of different application scenarios.

SUMMARY

In a first aspect, the present disclosure provides an organic electroluminescent device, including:
  a first electrode, a second electrode, and a light-emitting layer between the first electrode and the second electrode;
  a functional electrode is arranged on a side of at least one of the first electrode and the second electrode, which is away from the light-emitting layer;
  the functional electrode includes a first layer-stacked structure including a plurality of first light-transmitting layers and at least one second light-transmitting layer; where the first and second light-transmitting layers are stacked alternately; in the first layer-stacked structure, both the layer closest to the light-emitting layer and the layer farthest from the light-emitting layer are the first light-transmitting layers;
  a refractive index of the first light-transmitting layer is greater than a refractive index of the second light-transmitting layer.

In some implementations, the functional electrode is disposed on the side of the first electrode away from the light-emitting layer, the first electrode being common to the first light-transmitting layer closest to the light-emitting layer in the functional electrode.

In some implementations, an area of an orthographic projection of the second light-transmitting layer closest to the first light-transmitting layer being common to the first electrode on the second electrode is smaller than an area of an orthographic projection of the first light-transmitting layer being common to the first electrode on the second electrode.

In some implementations, the functional electrode is disposed on the side of the second electrode away from the light-emitting layer, the second electrode being common to the first light-transmitting layer closest to the light-emitting layer in the functional electrode.

In some implementations, an area of an orthographic projection of the second light-transmitting layer closest to the first light-transmitting layer being common to the second electrode on the first electrode is smaller than an area of an orthographic projection of the first light-transmitting layer being common to the second electrode on the first electrode.

In some implementations, an optical thickness of the first light-transmitting layer and an optical thickness of the second light-transmitting layer each are (2n+1) times a quarter wavelength, where n is a positive integer.

In some implementations, the functional electrode further includes an electro-optic material layer and a second layer-stacked structure;
  the electro-optical material layer is arranged on a side of the first layer-stacked structure away from the light-emitting layer, and has different refractive indexes under different driving voltages;
  the second layer-stacked structure is arranged on a side of the electro-optical material layer away from the light-emitting layer, and includes a plurality of third light-transmitting layers and at least one fourth light-transmitting layer; the third and fourth light-transmitting layers are stacked alternately; in the second layer-stacked structure, both the layer closest to the light-emitting layer and the layer farthest from the light-emitting layer are the third light-transmitting layers;
  a refractive index of the third light-transmitting layer is greater than a refractive index of the fourth light-transmitting layer.

In some implementations, the functional electrode is a transmission electrode, the electro-optic material layer has an optical thickness being n times one-half wavelength, where n is a positive integer.

In some implementations, the functional electrode is a reflective electrode, the electro-optic material layer has an optical thickness being (2n+1) times a quarter wavelength, where n is a positive integer.

In some implementations, the electro-optic material layer includes at least one of deuterated potassium dihydrogen phosphate (DKDP), ammonium dihydrogen phosphate (ADP), lithium niobate (LN) crystal, LT crystal, gallium arsenide (GaAs), and tin telluride.

In some implementations, an optical thickness of the first light-transmitting layer, an optical thickness of the second light-transmitting layer, an optical thickness of the third light-transmitting layer, and an optical thickness of the fourth light-transmitting layer each are (2n+1) times a quarter wavelength, where n is a positive integer.

In some implementations, an area of an orthographic projection of the electro-optic material layer on the first electrode or the second electrode is less than an area of an orthographic projection of the first and third light-transmitting layers closest to the electro-optic material layer on the first electrode or the second electrode.

In some implementations, the functional electrode is disposed on the side of the first electrode away from the light-emitting layer, and the organic electroluminescent device further includes a first optical adjustment layer disposed between the first light-transmitting layer of the functional electrode closest to the light-emitting layer and the first electrode;

the refractive index of the first light-transmitting layer and a refractive index of the first electrode each are greater than a refractive index of the first optical adjustment layer.

In some implementations, the functional electrode is disposed on the side of the second electrode away from the light-emitting layer, and the organic electroluminescent device further includes a second optical adjustment layer disposed between the first light-transmitting layer of the functional electrode closest to the light-emitting layer and the second electrode;

the refractive index of the first light-transmitting layer and a refractive index of the second electrode each are greater than a refractive index of the second optical adjustment layer.

In a second aspect, the present disclosure provides a display panel including a substrate, an organic electroluminescent device as described above disposed on the substrate, and a driving transistor disposed between the substrate and the organic electroluminescent device, the first electrode of the organic electroluminescent device being electrically coupled to the driving transistor.

In some implementations, the organic electroluminescent device includes a red organic electroluminescent device, a green organic electroluminescent device, and a blue organic electroluminescent device, and refractive indexes of first layer-stacked structures in organic electroluminescent devices of different colors are different.

DESCRIPTION OF EMBODIMENTS

In order that those skilled in the art will better understand the technical solutions of the present disclosure, the following detailed description is given with reference to the accompanying drawings and the specific embodiments.

Unless defined otherwise, technical or scientific terms used herein shall have the ordinary meaning as understood by one of ordinary skill in the art to which the present disclosure belongs. The use of "first," "second," and the like in the present disclosure is not intended to indicate any order, quantity, or importance, but rather is used to distinguish one element from another. Also, the use of the terms "a," "an," or "the" and similar referents do not denote a limitation of quantity, but rather denote the presence of at least one. The word "include" or "comprise", and the like, means that the element or item appearing in front of the word, and the equivalent thereof, contains the element or item listed after the word, but does not exclude other elements or items. The terms "connected" or "coupled" and the like are not restricted to physical or mechanical connections, but may include electrical connections, whether direct or indirect. Terms "upper/on", "lower/below", "left", "right", and the like are used only to indicate relative positional relationships, and when an absolute position of an object being described is changed, the relative positional relationships may also be changed accordingly.

Figure 1:
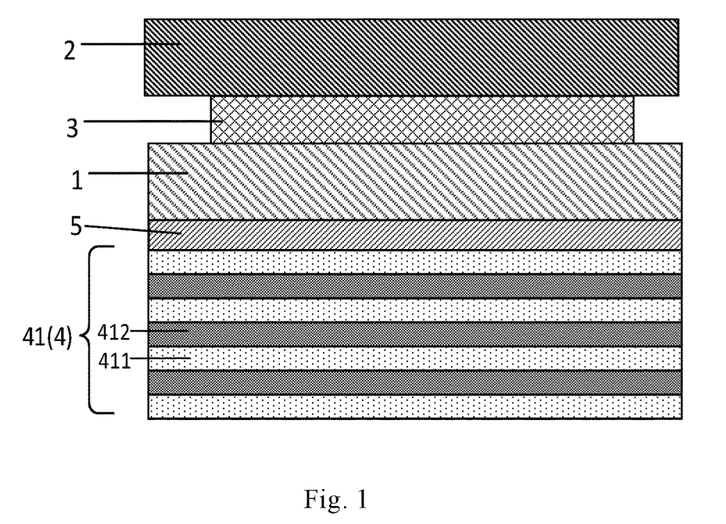
FIG. 1 is a schematic structural diagram of an organic electroluminescent device according to an embodiment of the present disclosure.
Figure 2:
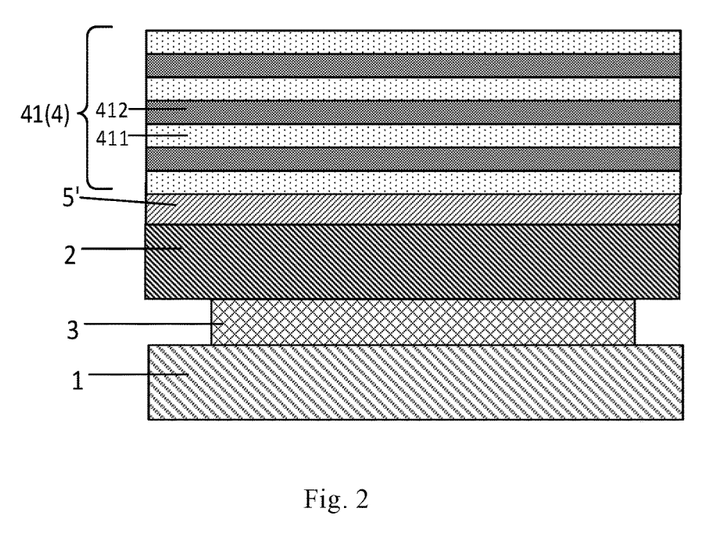
FIG. 2 is a schematic structural diagram of an organic electroluminescent device according to an embodiment of the present disclosure.

In a first aspect, referring to FIG. 1 and FIG. 2, an embodiment of the present disclosure provides an organic electroluminescent device, including a first electrode 1, a second electrode 2, and a light-emitting layer 3 located between the first electrode 1 and the second electrode 2, and a functional electrode 4 is disposed on a side of at least one of the first electrode 1 and the second electrode 2 away from the light-emitting layer 3.

Figure 3:
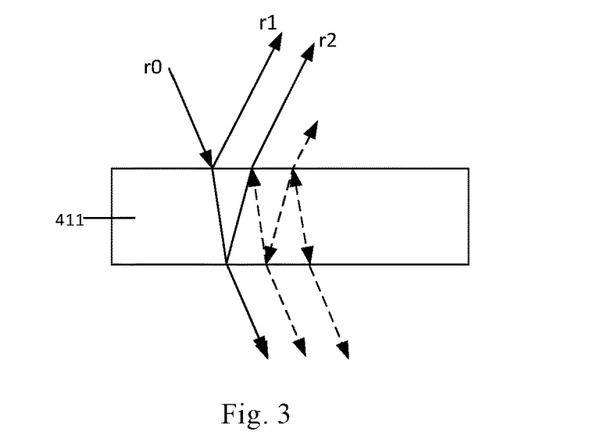
FIG. 3 is a schematic diagram of optical principle of an organic electroluminescent device according to an embodiment of the present disclosure.

Specifically, the functional electrode 4 includes a first layer-stacked structure 41, and the first layer-stacked structure 41 includes a plurality of first light-transmitting layers 411 and at least one second light-transmitting layer 412. The first light-transmitting layers 411 and the at least one second light-transmitting layer 412 are stacked alternately; and in the first layer-stacked structure 41, both the layer closest to the light-emitting layer 3 and the layer farthest from the light-emitting layer 3 are the first light-transmitting layers 411, that is, outermost sides of the first layer-stacked structure 41 are always disposed with the first light-transmitting layers 411 respectively, and thus if the first layer-stacked structure 41 includes only one second light-transmitting layer 412 and two first light-transmitting layers 411, the second light-transmitting layer 412 is located between the two first light-transmitting layers 411. A refractive index of the first light-transmitting layer 411 is greater than that of the second light-transmitting layer 412, and the first layer-stacked structure 41 arranged in the above manner forms a Distributed Bragg Reflection (DBR) structure. The DBR structure has a relatively high reflectivity or relatively high transmittance for a preset optical wavelength band by alternately stacking at least two kinds of medium layers (for example, the first light-transmitting layer 411 and the second light-transmitting layer 412) having different refractive indexes, specifically, light is irradiated onto the first layer-stacked structure 41 of the functional electrode 4, Fresnel reflection occurs at each interface in the first layer-stacked structure 41, and an optical path difference between two beams of reflected light at two adjacent interfaces for the light having a wavelength within the preset optical wavelength band can be adjusted by adjusting optical thicknesses of the first light-transmitting layer 411 and the second light-transmitting layer 412, as shown in FIG. 3, taking the first light-transmitting layer 411 as an example, incident light r0 of the preset optical wavelength band is irradiated to the first light-transmitting layer 411, a first reflected light r1 is generated at an upper surface thereof, a second reflected light r2 is generated at a lower surface thereof (i.e., the interface between the first light-transmitting layer 411 and the second light-transmitting layer 412), if the optical path difference between the first reflected light r1 and the second reflected light r2 is one wavelength, that is, a phase difference therebetween is $2\pi$, constructive interference occurs between the first reflected light r1 and the second reflected light r2, and light intensity of the reflected light is enhanced; when the optical path difference between the first reflected light r1 and the second reflected light r2 is one-half wavelength, that is, a phase difference therebetween is $\pi$, destructive interference occurs between the first reflected light r1 and the second reflected light r2, the reflected light is attenuated, and accordingly, the transmitted light is enhanced. The first light-transmitting layers 411 and the at least one second light-transmitting layer 412 in the first layer-stacked structure 41 are alternately stacked, and by adjusting optical thicknesses of the first light-transmitting layer 411 and the second light-transmitting layer 412, constructive interference is enabled between beams of light reflected at the interfaces, and the functional electrode 4 can serve as a reflective electrode; or, destructive interference is enabled between beams of light reflected at the interfaces, and the functional electrode 4 can serve as a transmission electrode, so that when the functional electrode 4 is arranged on the side of at least one of the first electrode 1 and the second electrode 2 away from the light-emitting layer 3, the reflectivity or the transmittance of the first electrode 1 and/or the second electrode 2 can be increased, thereby the reflectivity or the transmittance of the organic electroluminescent device can be enhanced, and the reflectivity or the transmittance of a display panel including the organic electroluminescent device can be enhanced, so as to provide display panels applied in different scenes.

In some implementations, the optical thickness of the first light-transmitting layer 411 and the optical thickness of the second light-transmitting layer 412 each are $(2n+1)$ times a quarter wavelength, where n is a positive integer, and thus, without considering a half-wave loss, the optical path difference between two beams of reflected light beams (e.g., r1 and r2) reflected by two adjacent interfaces in the first layer-stacked structure 41 is constant at one-half wavelength. Since the refractive index of the first light-transmitting layer 411 is greater than that of the second light-transmitting layer 412, and the first light-transmitting layers 411 and the at least one second light-transmitting layer 412 are alternately stacked, when light passes through two adjacent interfaces in the first layer-stacked structure 41, the light always enters an optically dense medium from an optically sparse medium at one interface, and enters an optically sparse medium from the optically dense medium at the other interface, that is, always only one half-wave loss occurs, so that the optical path difference between the two beams of reflected light is one wavelength, and the reflectivity of the first electrode 1 and/or the second electrode 2 provided with the functional electrode 4 can be increased.

Note that, the optical thickness of the first light-transmitting layer 411 is a product of a physical thickness of the first light-transmitting layer 411 and the refractive index thereof; the optical thickness of the second transparent layer 412 is a product of a physical thickness of the second transparent layer 412 and the refractive index thereof.

It should be noted that one of the first electrode 1 and the second electrode 2 is an anode, and the other is a cathode, which can be interchanged, and when the organic electroluminescent device is applied to a display panel, the organic electroluminescent device may be a top emission light-emitting device, and may also be a bottom emission light-emitting device, which is not limited herein.

In some examples, both outermost sides of the functional electrode 4 are the first light-transmitting layers 411 with a relatively high refractive index, and if the functional electrode 4 is disposed on the side of the first electrode 1 away from the light-emitting layer 3, the refractive index of the first electrode 1 itself may be substantially the same as or slightly different from that of the first light-transmitting layer 411, and in order to ensure that light passing through the first light-transmitting layer 411 always enters a film layer with a lower refractive index than the first light-transmitting layer 411, referring to FIG. 1, the organic electroluminescent device may further include a first optical adjustment layer 5, and the first optical adjustment layer 5 is disposed between the first light-transmitting layer 411 of the functional electrode 4 closest to the light-emitting layer 3 and the first electrode 1. The refractive index of the first light-transmitting layer 411 is greater than a refractive index of the first optical adjustment layer 5, and the refractive index of the first electrode 1 is greater than the refractive index of the first optical adjustment layer 5, that is, a low refractive index layer (i.e., the first optical adjustment layer 5) is disposed between the first electrode 1 and the first light-transmitting layer 411 of the functional electrode 4 closest to the light-emitting layer 3. Similarly, if the functional electrode 4 is disposed on the side of the second electrode 2 away from the light-emitting layer 3, the refractive index of the second electrode 2 itself may be substantially the same as or slightly different from that of the first light-transmitting layer 411, and in order to ensure that the light passing through the first light-transmitting layer 411 always enters a film layer with a lower refractive index than the first light-transmitting layer 411, referring to FIG. 2, the organic electroluminescent device may further include a second optical adjustment layer 5', and the second optical adjustment layer 5' is disposed between the first light-transmitting layer 411 of the functional electrode 4 closest to the light-emitting layer 3 and the second electrode 2. The refractive index of the first light-transmitting layer 411 is greater than a refractive index of the second optical adjustment layer 5', and the refractive index of the second electrode 2 is greater than the refractive index of the second optical adjustment layer 5', that is, a low refractive index layer (i.e., the second optical adjustment layer 5') is disposed between the second electrode 2 and the first light-transmitting layer 411 of the functional electrode 4 closest to the light-emitting layer 3.

In some implementations, a material of the first optical adjustment layer 5 may be the same as or different from that of the second optical adjustment layer 5', which is not limited herein. The first optical adjustment layer 5 and/or the second optical adjustment layer 5' may be the same as or different from the second light-transmitting layer 412 of the functional electrode 4, which is not limited herein.

It should be noted that, in the organic electroluminescent device according to the embodiment of the present disclosure, the number of first light-transmitting layers 411 and the number of second light-transmitting layers 412 included in the first layer-stacked structure 41 of the functional electrode 4 may be set as required, which is not limited herein, and FIG. 1 and FIG. 2 both take the first layer-stacked structure 41 including four first light-transmitting layers 411 and three second light-transmitting layers 412 as an example. Also, referring to FIG. 1, the functional electrode 4 may be disposed only on the side of the first electrode 1 away from the light-emitting layer 3 for increasing the reflectivity or transmittance of the first electrode 1; alternatively, referring to FIG. 2, the functional electrode 4 may be disposed only on the side of the second electrode 2 away from the light-emitting layer 3 for increasing the reflectivity or transmittance of the second electrode 2; certainly, the organic electroluminescent device may include two functional electrodes 4, one is disposed on the side of the first electrode 1 away from the light-emitting layer 3, and the other is disposed on the side of the second electrode 2 away from the light-emitting layer 3, so that the reflectivity or transmittance of each of the first electrode 1 and the second electrode 2 is adjusted, which is not limited herein. For convenience, the following takes the organic electroluminescent device in which the functional electrode 4 is disposed on the side of first electrode 1 away from the light-emitting layer 3 as an example for explanation, but the present disclosure is not limited thereto.

Figure 4:
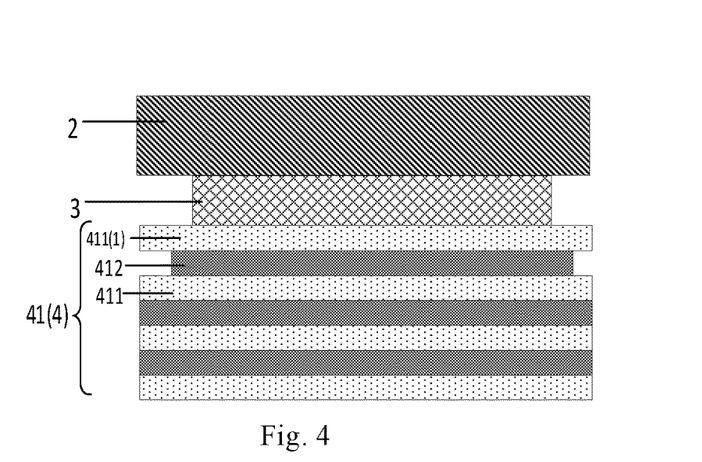
FIG. 4 is a schematic structural diagram of an organic electroluminescent device according to an embodiment of the present disclosure.
Figure 5:
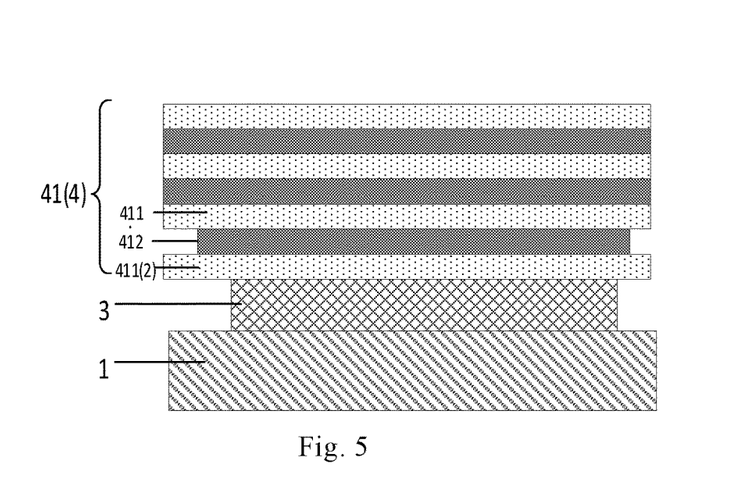
FIG. 5 is a schematic structural diagram of an organic electroluminescent device according to an embodiment of the present disclosure.

In some examples, referring to FIGS. 1 and 2, the functional electrode 4 may be separately disposed on the side of the first electrode 1 and/or the second electrode 2 away from the light-emitting layer 3, certainly, referring to FIGS. 4 and 5, the functional electrode 4 may also be disposed directly on a side of the light-emitting layer 3 for serving as the first electrode 1 and/or the second electrode 2. Specifically, referring to FIG. 4, the functional electrode 4 may be disposed on the side of the light-emitting layer 3 away from the second electrode 2, and the first light-transmitting layer 411, closest to the light-emitting layer 3, in the first layer-stacked structure 41 of the functional electrode 4 may serve as the first electrode 1 of the organic electroluminescent device. Referring to FIG. 5, the functional electrode 4 may be disposed on the side of the light-emitting layer 3 away from the first electrode 1, and the first light-transmitting layer 411, closest to the light-emitting layer 3, in the first layer-stacked structure 41 of the functional electrode 4 may serve as the second electrode 2 of the organic electroluminescent device.

That is, the first electrode 1 may be common to the first light-transmitting layer 411, closest to the light-emitting layer 3, in the first layer-stacked structure 41 of the functional electrode 4, or the second electrode 2 may be common to the first light-transmitting layer 411, closest to the light-emitting layer 3, in the first layer-stacked structure 41 of the functional electrode 4.

It is to be understood that if the first light-transmitting layer 411, closest to the light-emitting layer 3, in the first layer-stacked structure 41 of the functional electrode 4 serves as the first electrode 1 or the second electrode 2, an operating voltage of the organic electroluminescent device needs to be input into the first light-transmitting layer 411, closest to the light-emitting layer 3, in the first layer-stacked structure 41 of the functional electrode 4. In order to facilitate inputting of the operating voltage into the first light-transmitting layer 411, in the first layer-stacked structure 41, an area of an orthographic projection of the second light-transmitting layer 412, which is closest to the first light-transmitting layer 411 into which the operating voltage is input, on the second electrode 2 or the first electrode 1 may be smaller than an area of an orthographic projection of the first light-transmitting layer 411, into which the operating voltage is input, on the second electrode 2 or the first electrode 1, so as to facilitate a connection of the first light-transmitting layer 411 with a connection line for receiving the operating voltage through the connection line, certainly, the present disclosure is not limited thereto, for example, an area of an orthographic projection of each second light-transmitting layer 412 in the first layer-stacked structure 41 of the functional electrode 4 on the second electrode 2 or the first electrode 1 may be smaller than an area of an orthographic projection of each first light-transmitting layer 411 on the second electrode 2 or the first electrode 1.

Figure 6:
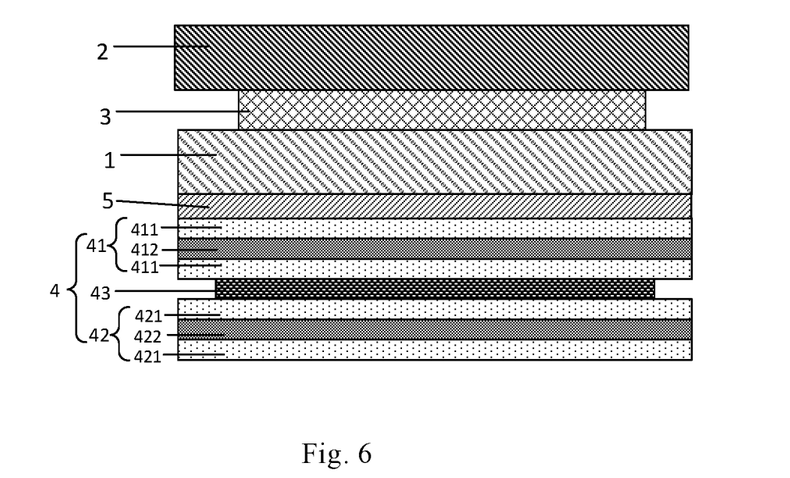
FIG. 6 is a schematic structural diagram of an organic electroluminescent device according to an embodiment of the present disclosure.
Figure 7:
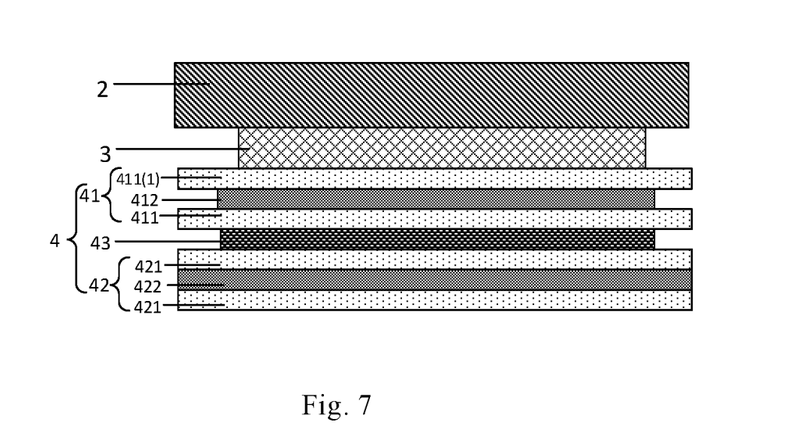
FIG. 7 is a schematic structural diagram of an organic electroluminescent device according to an embodiment of the present disclosure.

In some examples, referring to FIGS. 6 and 7, taking the functional electrode 4 being only disposed on a side of the first electrode 1 away from the light-emitting layer 3 as an example, the functional electrode 4 of the organic electroluminescent device according to the embodiment of the present disclosure may include the first layer-stacked structure 41, and may further include an electro-optic material layer 43 and a second layer-stacked structure 42. The electro-optical material layer 43 is arranged on a side of the first layer-stacked structure 41 away from the light-emitting layer 3 and the second layer-stacked structure 42 is arranged on a side of the electro-optical material layer 43 away from the light-emitting layer 3.

The electro-optic material layer 43 can have different refractive indexes under different driving voltages. The second layer-stacked structure 42 includes a plurality of third light-transmitting layers 421 and at least one fourth light-transmitting layer 422, similar to the first layer-stacked structure 41, the third light-transmitting layers 421 and the at least one fourth light-transmitting layer 422 are stacked alternately. Moreover, in the second layer-stacked structure 42, both the layer closest to the light-emitting layer 3 and the layer farthest from the light-emitting layer 3 are the third light-transmitting layers 421, that is, outermost sides of the second layer-stacked structure 42 are always the third light-transmitting layers 421 respectively, and therefore, if the second layer-stacked structure 42 includes only one fourth light-transmitting layer 422 and two third light-transmitting layers 421, the fourth light-transmitting layer 422 is located between the two third light-transmitting layers 421. A refractive index of the third light-transmitting layer 421 is greater than a refractive index of the fourth light-transmitting layer 422, and the second layer-stacked structure 42 arranged in the above manner forms a Distributed Bragg Reflection structure (DBR).

In some examples, the optical thickness of the first light-transmitting layer 411 and the optical thickness of the second light-transmitting layer 412 of the first layer-stacked structure 41 each may be $(2n+1)$ times the quarter wavelength; an optical thickness of the third light-transmitting layer 421 and an optical thickness of the fourth light-transmitting layer 422 in the second layer-stacked structure 42 each may be $(2n+1)$ times the quarter wavelength, where n is a positive integer. Considering a half-wave loss, the optical path difference between two beams of reflected light reflected by two adjacent interfaces in the first layer-stacked structure 41 is always one wavelength, that is, the phase difference therebetween is $2\pi$, and light intensity of the reflected light of the first layer-stacked structure 41 can be enhanced; considering the half-wave loss, an optical path difference between two beams of reflected light reflected by two adjacent interfaces in the second layer-stacked structure 42 is always one wavelength, that is, the phase difference is $2\pi$, and light intensity of the reflected light in the second layer-stacked structure 42 can be enhanced.

Further, since the electro-optical material layer 43 is disposed between the first layer-stacked structure 41 and the second layer-stacked structure 42, the functional electrode 4 is formed by disposing the electro-optical material layer 43 between two layer-stacked structures (the first layer-stacked structure 41 and the second layer-stacked structure 42), each of which is formed according to a feature of the Distributed Bragg Reflection (DBR) structure. Since the outermost sides of the first layer-stacked structure 41 are the first light-transmitting layers 411 having a relatively high refractive index, the outermost sides of the second layer-stacked structure 42 are the third light-transmitting layers 421 having a relatively high refractive index, film layers disposed on both sides of the electro-optic material layer 43 and adjacent to the electro-optic material layer 43 are the first light-transmitting layer 411 and the third light-transmitting layer 421, and if the functional electrode 4 needs to be a transmission electrode, that is, the functional electrode 4 transmits the light irradiated thereto, a first driving voltage is applied to the electro-optical material layer 43 so that the optical thickness of the electro-optical material layer 43 is n times one-half wavelength, n is a positive integer, when the light is irradiated to the functional electrode 4, the optical path difference between two beams of reflected light reflected by two adjacent interfaces is one-half wavelength, the phase difference therebetween is π, destructive interference occurs between the beams of reflected light, the reflected light of the functional electrode 4 is entirely attenuated, and correspondingly, the transmitted light is enhanced, so that the functional electrode 4 serves as a transmission electrode; if the functional electrode 4 needs to be a reflective electrode, that is, the functional electrode 4 reflects light irradiated thereto, a second driving voltage is applied to the electro-optical material layer 43 so that the optical thickness of the electro-optical material layer 43 is (2n+1) times the quarter wavelength, n is a positive integer, when light is irradiated to the functional electrode 4, the optical path difference between two beams of reflected light reflected at two adjacent interfaces is one wavelength, the phase difference therebetween is 2π, constructive interference occurs between the beams of reflected light, the reflected light of the functional electrode 4 is entirely enhanced, and accordingly, the transmitted light is attenuated, and thus the functional electrode 4 serves as a reflective electrode.

With the above arrangement, if the functional electrode 4 is disposed on the side of the first electrode 1 away from the light-emitting layer 3, the functional electrode 4 can serve as an reflection increasing layer or an transmission increasing layer of the first electrode 1 by applying the first driving voltage or the second driving voltage to the electro-optic material layer 43, thereby increasing the reflectivity or the transmittance of the first electrodes 1; similarly, if the functional electrode 4 is disposed on the side of the second electrode 2 away from the light-emitting layer 3, the functional electrode 4 can serve as an reflection increasing layer or an transmission increasing layer of the second electrode 2 by applying the first driving voltage or the second driving voltage to the electro-optic material layer 43, and the reflectivity or the transmittance of the second electrode 2 can be increased, so that an organic electroluminescent device with adjustable reflectivity and transmittance can be realized, and if the organic electroluminescent device is applied to a display panel, the display panel can be adapted to various scenes.

Alternatively, the functional electrode 4 may be disposed on the side of the light-emitting layer 3 away from the second electrode 2, and the first light-transmitting layer 411 of the functional electrode 4 closest to the light-emitting layer 3 also serves as the first electrode 1, in such case, by applying the first driving voltage or the second driving voltage to the electro-optical material layer 43, the functional electrode 4 can be made to include the first electrode 1, and the reflection increasing layer or the transmission increasing layer thereof, and the reflectivity or the transmittance of the first electrode 1 can be increased; similarly, functional electrode 4 may also be disposed on the side of the light-emitting layer 3 away from the first electrode 1, and the first light-transmitting layer 411 of the functional electrode 4 closest to the light-emitting layer 3 also serves as the second electrode 2, in such case, by applying the first driving voltage or the second driving voltage to the electro-optical material layer 43, the functional electrode 4 can be made to include the second electrode 2, and the reflection increasing layer or the transmission increasing layer thereof, and the reflectivity or the transmittance of the second electrode 2 can be increased.

In some implementations, the electro-optic material layer 43 may include at least one of deuterated potassium dihydrogen phosphate (DKDP), ammonium dihydrogen phosphate (ADP), lithium niobate (LN) crystal, LT crystal, gallium arsenide (GaAs), and tin telluride, and certainly, may also include other materials, which are not limited herein.

In some implementations, the material of the first light-transmitting layer 411 in the first layer-stacked structure 41 and/or the third light-transmitting layer 421 in the second layer-stacked structure 42 may include one or more transparent conductive materials, for example, may include one or more of Indium Tin Oxide (ITO), Tin Oxide (TO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Aluminum Tin Oxide (ATO), Gallium Zinc Oxide (GZO), IrOx, RuOx/ITO, Ni, Ag, Ni/IrOx/Au, or Ni/IrOx/Au/ITO, which is not limited herein.

In some implementations, the material of second light-transmitting layer 412 in first layer-stacked structure 41 and/or the fourth light-transmitting layer 422 in second layer-stacked structure 42 may include one or more transparent insulating materials, for example, may include at least one of silicon dioxide and lithium fluoride, but may also be other materials, which is not limited herein.

In some examples, in order to input a driving voltage (including the first driving voltage or the second driving voltage) into the electro-optical material layer 43, a voltage may be input into two layers in direct contact with the electro-optical material layer 43, that is, the first light-transmitting layer 411, closest to the electro-optical material layer 43, in the first layer-stacked structure 41 and the third light-transmitting layer 421, closest to the electro-optical material layer 43, in the second layer-stacked structure 42 serve as upper and lower electrodes of the electro-optical material layer 43, and the electro-optical material layer 43 is applied with the driving voltage through the first light-transmitting layer 411 and the third light-transmitting layer 421. In order to facilitate inputting of the driving voltage into the first light-transmitting layer 411 and the third light-transmitting layer 421, an area of an orthographic projection of the electro-optical material layer 43 on the first electrode 1 or the second electrode 2 may be smaller than the area of the orthographic projection of the first light-transmitting layer 411, closest to the electro-optical material layer 43, on the first electrode 1 or the second electrode 2, and may be smaller than the area of an orthographic projection of the third light-transmitting layer 421, closest to the electro-optical material layer 43, on the first electrode 1 or the second electrode 2, so that the first light-transmitting layer 411 and the third light-transmitting layer 421 are conveniently coupled to a driving voltage source.

In some examples, if the functional electrode 4 includes the first layer-stacked structure 41, the electro-optic material layer 43 and the second layer-stacked structure 42, referring to FIG. 6, the functional electrode 4 may be separately disposed on the side of the first electrode 1 and/or the second electrode 2 away from the light-emitting layer 3, or, referring to FIG. 7, the first light-transmitting layer 411 of the functional electrode 4 closest to the light-emitting layer 3 may serve as the first electrode 1 and/or the second electrode 2. Taking FIG. 7 as an example, if the first light-transmitting layer 411 of the functional electrode 4 closest to the light-emitting layer 3 serves as the first electrode 1 and/or the second electrode 2, the first light-transmitting layer 411 closest to the light-emitting layer 3 and the first light-transmitting layer 411 closest to the electro-optical material layer 43 are insulated from each other to avoid a short circuit.

It should be understood that although FIGS. 6 and 7 show only an example in which the functional electrode 4 is disposed on the side of the light-emitting layer 3 away from the second electrode 2, the present disclosure is not limited thereto. In practical applications, as shown in FIG. 2 and FIG. 5, the functional electrode 4 may also be disposed on the side of the light-emitting layer 3 away from the first electrode 1, or the functional electrodes 4 may be disposed on both sides of the light-emitting layer 3, which is not described herein again.

Figure 8:
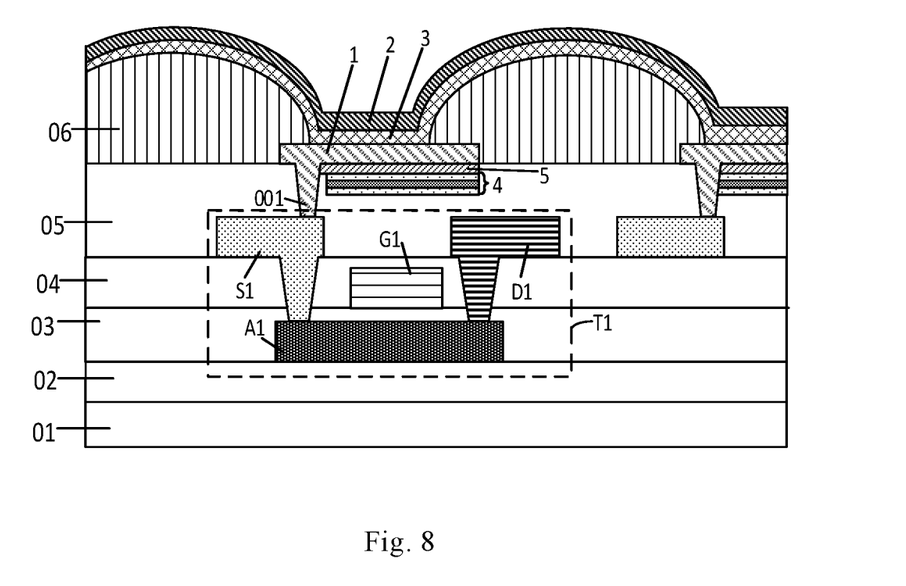
FIG. 8 is a schematic structural diagram of a display panel according to an embodiment of the present disclosure.
Figure 9:
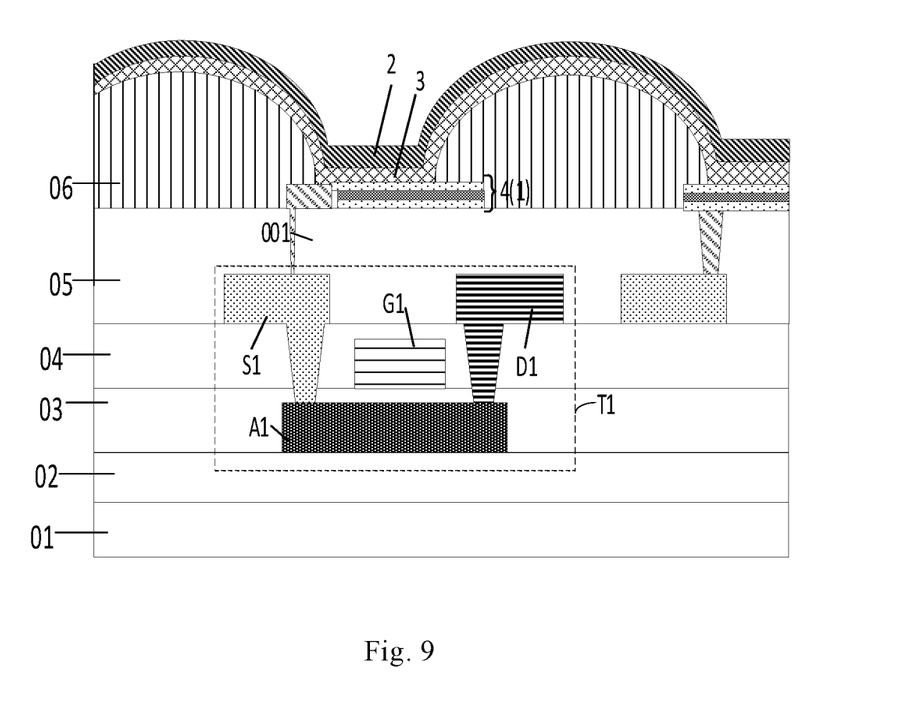
FIG. 9 is a schematic structural diagram of a display panel according to an embodiment of the present disclosure.

In a second aspect, referring to FIGS. 8 and 9, an embodiment of the present disclosure further provides a display panel, where the display panel includes a substrate 01 and a plurality of organic electroluminescent devices each as described above disposed on the substrate 01, the plurality of organic electroluminescent devices may be arranged on the substrate 01 in an array, and the first electrode 1 may be closer to the substrate 01 than the second electrode 2. A driving circuit may be further disposed between the substrate 01 and the organic light emitting devices, the driving circuit includes a plurality of transistors, taking a layer structure of a transistor T1 as an example, the display panel may further include a buffer layer 02, an active layer al, a gate insulating layer 03, a gate G1, a first insulating layer 04, a source S1 and a drain D1, and a planarization layer 05 sequentially disposed on the substrate 01, the active layer A1, the gate G1, the source S1, and the drain D1 constitute the transistor T1, and the gate S1 and the drain D1 are disposed in a same layer and coupled to the active layer A1 through via holes disposed in the gate insulating layer 03 and the first insulating layer 04, and the planarization layer 05 has a via hole therein, and the first electrode 1 of the organic electroluminescent device is electrically coupled to the transistor T1 through a connection electrode 001 extending along the via hole. The functional electrode 4 of the organic electroluminescent device may be provided separately on the side of the first electrode 1 away from the light-emitting layer 3, as shown in FIG. 8, or the first light-transmitting layer 411 of the functional electrode 4 of the organic electroluminescent device closest to the light-emitting layer 3 may also serve as the first electrode 1, as shown in FIG. 9. If the functional electrode 4 is separately disposed on the side of the first electrode 1 away from the light-emitting layer 3, since the first electrode 1 needs to be coupled to the transistor T1 through the connection electrode 001, in order to avoid a short circuit between the connection electrode 001 and the functional electrode 4, specifically, in order to avoid a short circuit between the connection electrode 001 and the first light-transmitting layer 411 and the third light-transmitting layer 421 of the functional electrode 4 on both sides of the electro-optical material layer 43, an orthographic projection of the connection electrode 001 on the substrate 01 (that is, an orthographic projection of the via hole in the planarization layer 05 on the substrate 01) and an orthographic projection of the functional electrode 4 on the substrate 01 do not overlap.

In some implementations, the display panel may further include a pixel defining layer 06 disposed between adjacent organic electroluminescent devices, such that the first electrode 1, the light-emitting layer 3, the second electrode 2, the functional electrode 4 of the organic electroluminescent device and the pixel defining layer 06 may form a microcavity structure, so as to ensure light intensity of emitted light, and if the functional electrode 4 is disposed below the first electrode 1 or serves as the first electrode 1, when light emitted by the light-emitting layer 3 is irradiated to the first electrode 1 or the functional electrode 4, the functional electrode 4 can serve as a reflective electrode to reflect the light, so as to ensure light emission efficiency of the microcavity structure.

In some implementations, the functional electrode 4 can serve as a transmission electrode or a reflective electrode by adjusting the optical thickness of each layer in the first layer-stacked structure 41 of the functional electrode 4 in the organic electroluminescent device, or, if the functional electrode 4 includes the electro-optic material layer 43, by adjusting the optical thickness of the electro-optic material layer 43 and changing the driving voltage of the electro-optic material layer 43, the functional electrode 4 can serve as a transmission electrode or a reflective electrode, and thus if the organic electroluminescent device of the embodiment of the present disclosure is applied to a display panel, the display panel can be adapted to various application scenarios.

In addition, the display panel to which the organic electroluminescent device of the embodiment of the present disclosure is applied can also realize multiple functions by selectively arranging the functional electrode 4 on the side of the first electrode 1 and/or the second electrode 2 away from the light-emitting layer 3. For example, in an application scenario of a transparent display panel, the functional electrode 4 may be disposed on the side of at least one of the first electrode 1 and the second electrode 2 away from the light-emitting layer 3, and the functional electrode 4 is made to serve as a transmission electrode, so that the transmittance of the display panel is entirely increased, and transparent display is achieved; for another example, in an application scenario of a dual-sided display panel, the functional electrode 4 may be disposed on each of the side of the first electrode 1 away from the light-emitting layer 3 and the side of the second electrode 2 away from the light-emitting layer 3 in the organic electroluminescent device, in a single-sided display mode, the optical thickness of the electro-optical material layer 43 may be (2n+1) times the quarter wavelength, where n is a positive integer, the functional electrode 4 serves as the reflective electrode, and the light emission efficiency of the organic electroluminescent device is ensured, in a dual-sided display mode, the optical thickness of the electro-optical material layer 43 in the functional electrode 4 on each of the side of the first electrode 1 away from the light-emitting layer 3 and the side of the second electrode 2 away from the light-emitting layer 3 may be adjusted to be n times one-half wavelength, where n is a positive integer, the functional electrode 4 serves as a transmission electrode, and light emitted by the light-emitting layer 3 can transmit toward both sides thereof, therefore, double-sided display can be realized; or, in an application of realizing a full-screen, the organic electroluminescent device according to the embodiment of the present disclosure may be disposed in a camera area, and the functional electrode 4 is at least disposed on the side of the first electrode 1 and/or the second electrode 2, away from the light-emitting layer 3, of the organic electroluminescent device in the camera area, and the functional electrode 4 includes the electro-optical material layer 43, so that during displaying normally, by applying a corresponding driving voltage to the electro-optical material layer 43, the functional electrode 4 serves as the reflective electrode to cover the camera for realizing a full-screen display, and during a photo needs to be taken by the camera, the functional electrode 4 serves as the transmission electrode by applying a corresponding driving voltage to the electro-optical material layer 43, thereby allowing light to normally enter the camera and realizing a photo taking function.

In some examples, the organic electroluminescent devices in the display panel according to the embodiment of the present disclosure include organic electroluminescent devices of a plurality of colors, for example, the organic electroluminescent devices may include a red organic electroluminescent device, a green organic electroluminescent device, and a blue organic electroluminescent device, and since wavelength bands of different colors of light are different, first layer-stacked structures 41 of functional electrodes 4 in the organic electroluminescent devices of different colors may be designed differently.

Specifically, assuming that a refractive index of an initial medium, from which the light transmits into the functional electrode 4, is $n_0$, for example, a refractive index of an air medium is $n_0$, the refractive index of each of the first light-transmitting layer 411, the third light-transmitting layer 421 and the electro-optical material layer 43 in a transmission mode is $n_1$, the refractive index of each of the second light-transmitting layer 412, the fourth light-transmitting layer 422 and the electro-optical material layer 43 in a reflective mode is $n_2$, and a refractive index of a final medium, into which the light from the functional electrode 4 enters, is $n_s$, a Bragg reflectivity R of the functional electrode 4 is:

$$R = \left[ \frac{n_o(n_2)^{2N} - n_s(n_1)^{2N}}{n_o(n_2)^{2N} + n_s(n_1)^{2N}} \right]^2,$$

a reflection bandwidth is:

$$\frac{\Delta f_0}{f_0} = \frac{4}{\pi} \arcsin\left( \frac{n_2 - n_1}{n_2 + n_1} \right),$$

where $f_0$ is a center frequency of light spectrum, $\Delta f_0/f_0$ is a maximum reflection bandwidth which can be achieved by the film layers having two refractive indexes (e.g., the first transparent layer 411 and the second transparent layer 412), the film layers having the two refractive indexes to be used in the functional electrode 4 can be determined according to the above formulas, and regarding the reflectivity of the organic electroluminescent device to wavelengths of emitted red light, green light and blue light, generally, the wavelength of the red light is about 620 nm, the wavelength of the blue light is about 460 nm, the wavelength of the green light is between the wavelength of the red light and the wavelength of the blue light, for example, is about 530 nm, therefore, the optical thickness (the product of the physical thickness of the film layer and the refractive index thereof) of each of the light-transmitting layers having the two refractive indexes in the first layer-stacked structure 41 and/or the second layer-stacked structure 42 of the functional electrode 4 can be set according to the wavelength of the green light, so that the functional electrode 4 can well reflect or transmit the light, in each of wavelength bands of such three colors, emitted by the organic electroluminescent devices; alternatively, the optical thickness of each of the light-transmitting layers having the two refractive indexes in the functional electrode 4 of the organic electroluminescent device with each of the three colors may be separately designed by referring to the above formulas with respect to wavelengths of light with the three colors respectively, so that the light reflectivity or transmittance of the functional electrode 4 for the light with each of the three colors reaches the maximum, which is not limited herein.

It will be understood that the above implementations are merely exemplary implementations employed to illustrate the principles of the present disclosure, and the present disclosure is not limited thereto. It will be apparent to those skilled in the art that various changes and modifications can be made therein without departing from the spirit and scope of the present disclosure, and these changes and modifications are also considered to fall within the scope of the present disclosure.

The invention claimed is:

1. An organic electroluminescent device, comprising: a first electrode, a second electrode, and a light-emitting layer between the first electrode and the second electrode; wherein
 a functional electrode is disposed on a side of at least one of the first electrode and the second electrode away from the light-emitting layer;
 the functional electrode comprises a first layer-stacked structure including a plurality of first light-transmitting layers and at least one second light-transmitting layer; wherein the first and second light-transmitting layers are stacked alternately; in the first layer-stacked structure, both the layer closest to the light-emitting layer and the layer farthest from the light-emitting layer are the first light-transmitting layers;
 a refractive index of the first light-transmitting layer is greater than a refractive index of the second light-transmitting layer.

2. The organic electroluminescent device according to claim 1, wherein the functional electrode is disposed on the side of the first electrode away from the light-emitting layer, the first electrode being common to the first light-transmitting layer of the functional electrode closest to the light-emitting layer.

3. The organic electroluminescent device according to claim 2, wherein an area of an orthographic projection of the second light-transmitting layer closest to the first light-transmitting layer being common to the first electrode on the second electrode is smaller than an area of an orthographic projection of the first light-transmitting layer being common to the first electrode on the second electrode.

4. The organic electroluminescent device according to claim 1, wherein the functional electrode is disposed on the side of the second electrode away from the light-emitting layer, the second electrode being common to the first light-transmitting layer of the functional electrode closest to the light-emitting layer.

5. The organic electroluminescent device according to claim 4, wherein an area of an orthographic projection of the second light-transmitting layer closest to the first light-transmitting layer being common to the second electrode on the first electrode is smaller than an area of an orthographic projection of the first light-transmitting layer being common to the second electrode on the first electrode.

6. The organic electroluminescent device according to claim 1, wherein an optical thickness of the first light-transmitting layer and an optical thickness of the second light-transmitting layer each are (2n+1) times a quarter wavelength, and n is a positive integer.

7. The organic electroluminescent device according to claim 1, wherein the functional electrode further comprises an electro-optic material layer and a second layer-stacked structure; wherein
the electro-optical material layer is disposed on a side of the first layer-stacked structure away from the light-emitting layer, and has different refractive indexes under different driving voltages;
the second layer-stacked structure is disposed on a side of the electro-optical material layer away from the light-emitting layer, and comprises a plurality of third light-transmitting layers and at least one fourth light-transmitting layer; wherein the third and fourth light-transmitting layers are stacked alternately; in the second layer-stacked structure, both the layer closest to the light-emitting layer and the layer farthest from the light-emitting layer are the third light-transmitting layers;
a refractive index of the third light-transmitting layer is greater than a refractive index of the fourth light-transmitting layer.

8. The organic electroluminescent device according to claim 7, wherein the functional electrode is a transmission electrode, the electro-optic material layer has an optical thickness of n times one-half wavelength, and n is a positive integer.

9. The organic electroluminescent device according to claim 7, wherein the functional electrode is a reflective electrode, the electro-optic material layer has an optical thickness of (2n+1) times a quarter wavelength, and n is a positive integer.

10. The organic electroluminescent device according to claim 7, wherein the electro-optic material layer comprises at least one of deuterated potassium dihydrogen phosphate (DKDP), ammonium dihydrogen phosphate (ADP), lithium niobate (LN) crystal, LT crystal, gallium arsenide (GaAs), and tin telluride.

11. The organic electroluminescent device according to claim 7, wherein an optical thickness of the first light-transmitting layer, an optical thickness of the second light-transmitting layer, an optical thickness of the third light-transmitting layer, and an optical thickness of the fourth light-transmitting layer each are (2n+1) times a quarter wavelength, and n is a positive integer.

12. The organic electroluminescent device according to claim 7, wherein an area of an orthographic projection of the electro-optic material layer on the first electrode or the second electrode is smaller than an area of an orthographic projection of each of the first light-transmitting layer and the third light-transmitting layer closest to the electro-optic material layer on the first electrode or the second electrode.

13. The organic electroluminescent device according to claim 1, wherein the functional electrode is disposed on the side of the first electrode away from the light-emitting layer, and the organic electroluminescent device further comprises a first optical adjustment layer disposed between the first light-transmitting layer of the functional electrode closest to the light-emitting layer and the first electrode;
each of the refractive index of the first light-transmitting layer and a refractive index of the first electrode is greater than a refractive index of the first optical adjustment layer.

14. The organic electroluminescent device according to claim 1, wherein the functional electrode is disposed on the side of the second electrode away from the light-emitting layer, and the organic electroluminescent device further comprises a second optical adjustment layer disposed between the first light-transmitting layer of the functional electrode closest to the light-emitting layer and the second electrode;
each of the refractive index of the first light-transmitting layer and a refractive index of the second electrode is greater than a refractive index of the second optical adjustment layer.

15. A display panel, comprising a substrate, the organic electroluminescent device according to claim 1 disposed on the substrate, and a driving transistor disposed between the substrate and the organic electroluminescent device, the first electrode of the organic electroluminescent device being electrically coupled to the driving transistor.

16. The display panel according to claim 15, wherein the organic electroluminescent device comprises a red organic electroluminescent device, a green organic electroluminescent device, and a blue organic electroluminescent device, and refractive indexes of first layer-stacked structures in organic electroluminescent devices of different colors are different from each other.

* * * * *